(12) United States Patent
Chang et al.

(10) Patent No.: US 8,159,028 B2
(45) Date of Patent: Apr. 17, 2012

(54) METAL HIGH DIELECTRIC CONSTANT TRANSISTOR WITH REVERSE-T GATE

(75) Inventors: Leland Chang, New York, NY (US);
Isaac Lauer, White Plains, NY (US);
Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 12/543,692

(22) Filed: Aug. 19, 2009

(65) Prior Publication Data
US 2009/0302400 A1    Dec. 10, 2009

Related U.S. Application Data

(62) Division of application No. 12/113,527, filed on May 1, 2008, now Pat. No. 7,736,981.

(51) Int. Cl.
*H01L 29/72* (2006.01)
(52) U.S. Cl. ......... 257/340; 257/401; 257/410; 257/412
(58) Field of Classification Search .................. 257/340, 257/401, 410, 412
See application file for complete search history.

(56) References Cited

U.S. PATENT DOCUMENTS

| | | |
|---|---|---|
| 5,580,803 A | 12/1996 | Oh et al. |
| 5,583,067 A | 12/1996 | Sanchez |
| 5,585,295 A | 12/1996 | Wu |
| 5,633,522 A | 5/1997 | Dorleans et al. |
| 5,654,218 A | 8/1997 | Lee |
| 5,712,503 A | 1/1998 | Kim et al. |
| 5,994,192 A | 11/1999 | Chen .......................... 438/303 |
| 6,043,545 A | 3/2000 | Tseng et al. |
| 6,057,576 A | 5/2000 | Hsia et al. |
| 6,130,135 A | 10/2000 | Wu |
| 6,300,207 B1 | 10/2001 | Ju |
| 6,380,008 B2 | 4/2002 | Kwok et al. |
| 6,475,890 B1 | 11/2002 | Yu |
| 6,551,913 B1 | 4/2003 | Kim et al. |
| 6,919,601 B2 | 7/2005 | Inaba |
| 7,449,403 B2 | 11/2008 | Kim et al. |
| 2004/0087091 A1 | 5/2004 | Setton |
| 2005/0186744 A1 | 8/2005 | Abadeer et al. |
| 2007/0128786 A1 | 6/2007 | Cheng et al. ................. 438/199 |
| 2008/0265343 A1* | 10/2008 | Greene et al. ................. 257/412 |

* cited by examiner

*Primary Examiner* — Edward Wojciechowicz
(74) *Attorney, Agent, or Firm* — Stephen Bongini; Fleit Gibbons Gutman Bongini & Bianco PL

(57) ABSTRACT

A transistor is provided. The transistor includes a silicon layer including a source region and a drain region. A gate stack is disposed on the silicon layer between the source region and the drain region. The gate stack comprises a first layer of a high dielectric constant material, a second layer comprising a metal or metal alloy, and a third layer comprising silicon or polysilicon. A lateral extent of the second layer of the gate stack is substantially greater than a lateral extent of the third layer of the gate stack. Also provided are methods for fabricating such a transistor.

20 Claims, 7 Drawing Sheets

METAL HIGH DIELECTRIC CONSTANT TRANSISTOR WITH REVERSE-T GATE

CROSS REFERENCE TO RELATED APPLICATIONS

This is a divisional of application Ser. No. 12/113,527, filed May 1, 2008, now U.S. Pat. No. 7,736,981. The entire disclosure of prior application Ser. No. 12/113,527 is herein incorporated by reference.

Additionally, this application is related to application "Transistor with High-K Dielectric Sidewall Spacer," Ser. No. 12/113,510, now pending, and application "Method for Fabricating a Metal High Dielectric Constant Transistor with Reverse-T Gate," Ser. No. 12/113,557, now abandoned, which were filed on the same day as application Serial No. 12/113,527 and commonly assigned therewith to International Business Machines Corporation. These related applications are incorporated herein by reference in their entirety.

FIELD OF THE INVENTION

The present invention generally relates to the field of semiconductors, and more particularly relates to metal high dielectric constant transistors.

BACKGROUND OF THE INVENTION

Metal high dielectric constant (high-k) transistors, or "MHK transistors", are experiencing extremely active development in the industry. One observed problem with such transistors relates to the presence of an elevated outer fringe capacitance Cof, on the order of 40-80 aF/μm. This elevated capacitance Cof occurs because the gate sidewall of an MHK transistor no longer depletes as in a transistor with a conventional polysilicon gate. The elevated value of outer fringe capacitance Cof is of concern because it at least impairs high frequency operation of the MHK transistor. The elevated value of this capacitance Cof has a performance impact of approximately 1.25% per 10 aF, resulting in a 5%-10% decrease in AC performance. Current technologies do not provide a reduction in the parasitic Miller capacitance when metal-like materials (such as TiN) are used.

SUMMARY OF THE INVENTION

One embodiment of the present invention provides a transistor. The transistor includes a silicon layer including a source region and a drain region. A gate stack is disposed on the silicon layer between the source region and the drain region. The gate stack comprises a first layer of a high dielectric constant material, a second layer comprising a metal or metal alloy, and a third layer comprising silicon or polysilicon. A lateral extent of the second layer of the gate stack is substantially greater than a lateral extent of the third layer of the gate stack.

Another embodiment of the present invention provides a method for fabricating a transistor. A silicon layer is provided and a first layer is formed on the silicon layer. A second layer is formed on the first layer, and a third layer is formed on the second layer. The first layer includes a high dielectric constant material, the second layer includes a metal or metal alloy, and the third layer comprises silicon or polysilicon. The first, second, and third layers are etched so as to form a gate stack. After this etching, the third layer of the gate stack is etched without etching the first and second layers of the gate stack, so as to substantially reduce the width of the third layer of the gate stack.

Yet another embodiment of the present invention provides another method for fabricating a transistor. A silicon layer is provided, and a first layer is formed on the silicon layer. A second layer is formed on the first layer, and a third layer is formed on the second layer. The first layer includes a high dielectric constant material, the second layer includes a metal or metal alloy, and the third layer comprises silicon or polysilicon. The third layer is etched without etching the first and second layers. After this etching, a spacer layer is deposited and etched so as to form a spacer on the sidewalls of the third layer. After this etching, the first and second layers are etched without etching the first layer, so as to form a gate stack comprising the first, second, and third layers. A lateral extent of the second layer of the gate stack is substantially greater than a lateral extent of the third layer of the gate stack.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION

Embodiments of the present invention provide metal high dielectric constant (high-k) transistors ("MHK transistors") with a reverse-T gate. The reverse-T gate includes a polysilicon layer with a substantially reduced width, which results in an increase in the distance between the polysilicon gate layer and the contact stud. Therefore, parasitic capacitance between the polysilicon gate layer and the contact stud is reduced.

Figure 1:
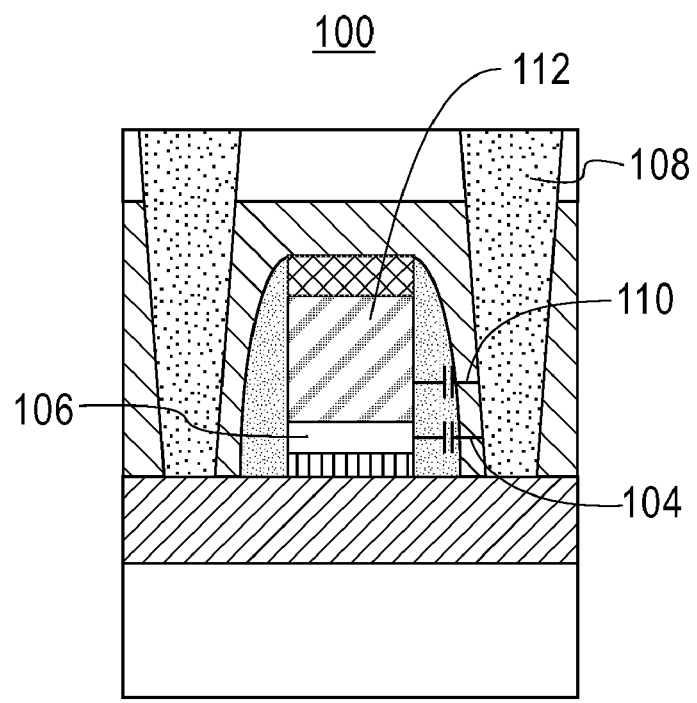
FIG. 1 is a cross-sectional view of a conventional metal high dielectric constant transistor.
Figure 2:
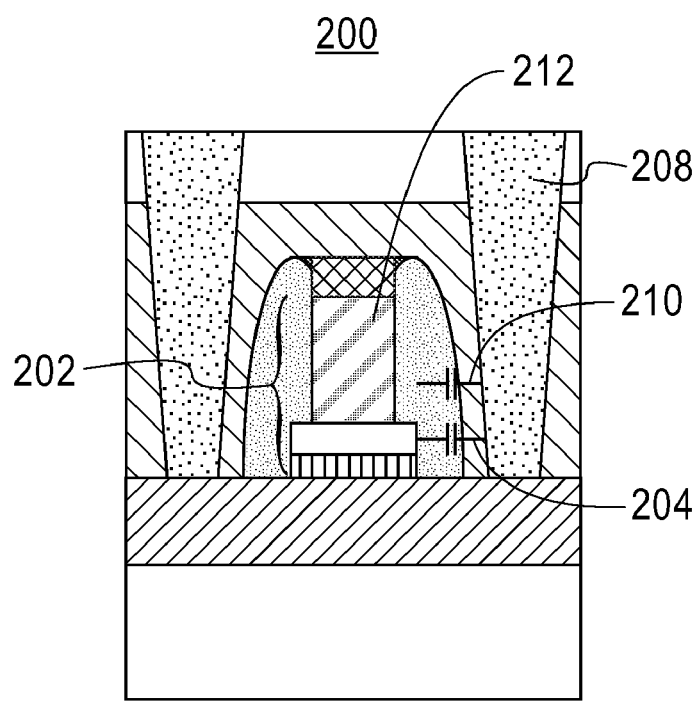
FIG. 2 is a cross-sectional view of a metal high dielectric constant transistor having a reverse-T gate in accordance with one embodiment of the present invention.

FIG. 1 shows a conventional MHK transistor, and FIG. 2 shows an MHK transistor having a reverse-T gate in accordance with one embodiment of the present invention. With respect to the conventional MHK transistor 100, a parasitic gate-to-contact capacitance is made up of a capacitance 104 between the metal gate layer 106 and the contact stud 108, and a capacitance 110 between the polysilicon gate layer 112 and the contact stud 108.

The MHK transistor 200 of FIG. 2 also has such a parasitic capacitance. However, in embodiments of the present invention, the polysilicon gate layer width is less than the width of the metal gate layer. For example, in this embodiment, the width of the polysilicon gate layer 212 is between about ⅓ and ½ of the width of the metal gate layer. Because the width of the polysilicon gate layer 212 is substantially reduced, the distance between the polysilicon gate layer 212 and the contact stud 208 is increased. Therefore, the capacitance between the polysilicon gate layer 212 and the contact stud 208 is reduced, which results in a parasitic gate-to-contact capacitance that is lower than in the conventional MHK transistor. As pitch scaling continues, this reduction in parasitic capacitance becomes more substantial.

FIGS. 3-7 show one embodiment of a process for fabricating an MHK transistor with a reverse-T gate. The process begins with a silicon-on-insulator (SOI) wafer that has, formed on a silicon substrate, an overlying oxide layer ("BOX") 314 (e.g., of 3 μm), and overlying silicon layer 316. A conventional high-k dielectric layer 318 and a metal layer 320 are deposited on the silicon layer 316. In this embodiment, the high-k layer 318 has an exemplary thickness in the range of about 1-3 nm, and comprises a material having a dielectric constant (k) in the range of about 20-25 (as compared to 3.9 for $SiO_2$), such as hafnium dioxide ($HfO_2$). The metal (or metal-like) layer 320 comprises a metal or metal alloy such as titanium nitride (TiN), and has a thickness of about 10 nm. These two layers 318 and 320 form the (as yet unpatterned) MHK gate stack layers. This initial structure represents a conventional SOI CMOS with an MHK gate stack. A polysilicon or (amorphous silicon) layer 312 is then deposited on top of the metal layer 320, with a thickness in the range of about 30-100 nm.

Figure 3:
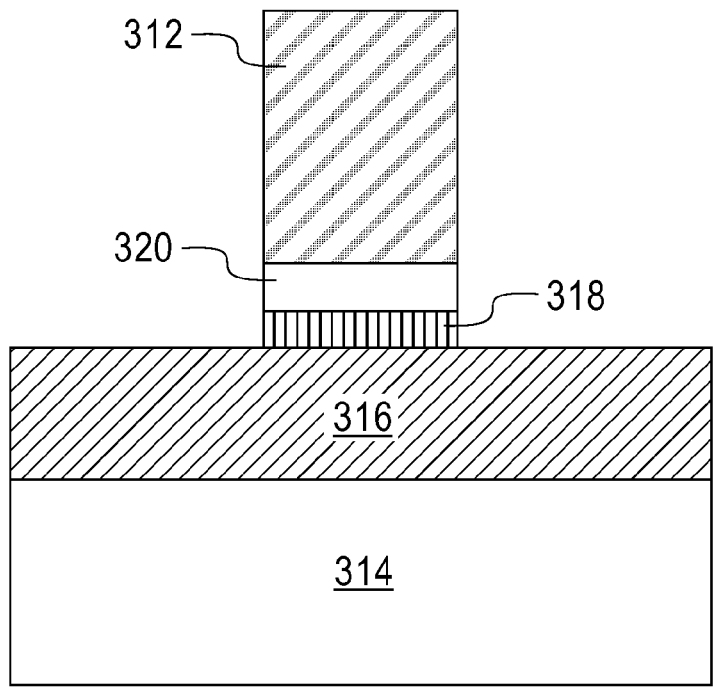
FIGS. 3-7 are cross-sectional views of a process for fabricating a metal high dielectric constant transistor having a reverse-T gate in accordance with a first embodiment of the present invention.
Figure 4:
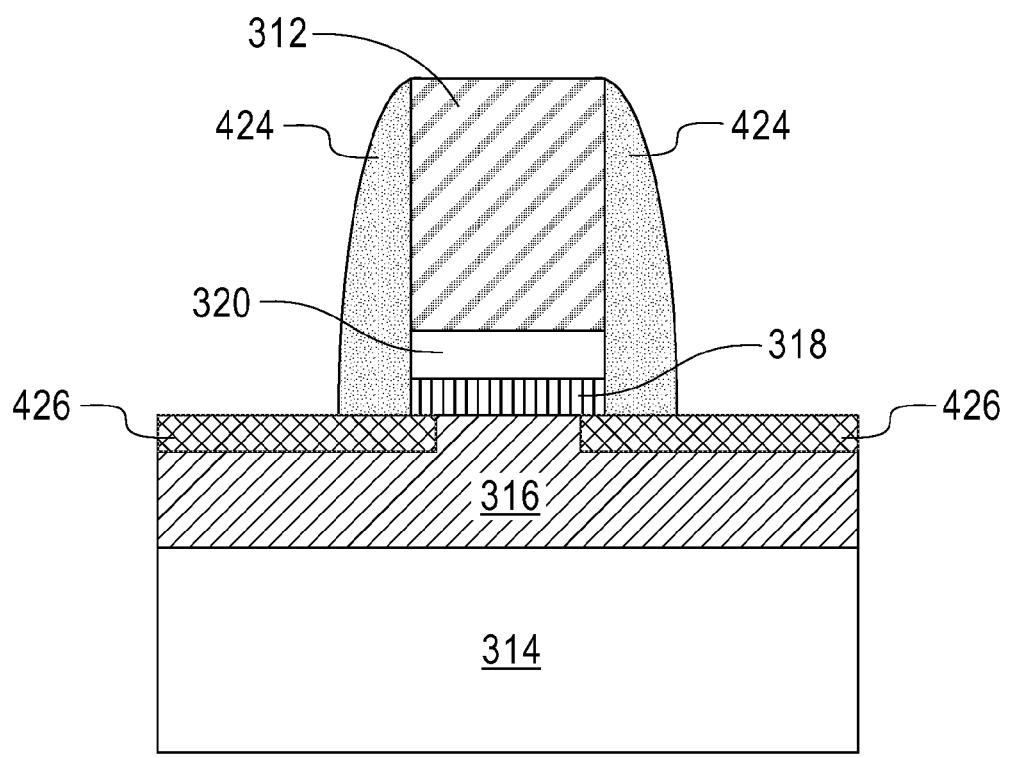

FIG. 3 shows the transistor formation process after a conventional gate stack etch has been performed (without showing the underlying silicon substrate for simplicity). In this embodiment, the gate stack etch stops at the silicon layer 316. After the gate stack is etched, a disposable spacer 424 is formed on the sidewalls of the gate stack, as shown in FIG. 4. The disposable spacer 424 of this embodiment is a nitride spacer that is formed by depositing a 5-50 nm thick nitride layer (e.g., using RTCVD or PECVD) and then performing a reactive ion etch (RIE) that stops on an underlying oxide liner so as not to consume any of the underlying silicon.

Photolithography and ion implantation are then used to define source/drain extensions. For an NFET the implant is performed using an n-type species, and for a PFET the implant is performed using a p-type species. Thus, source/drain extensions 426 are formed.

Figure 5:
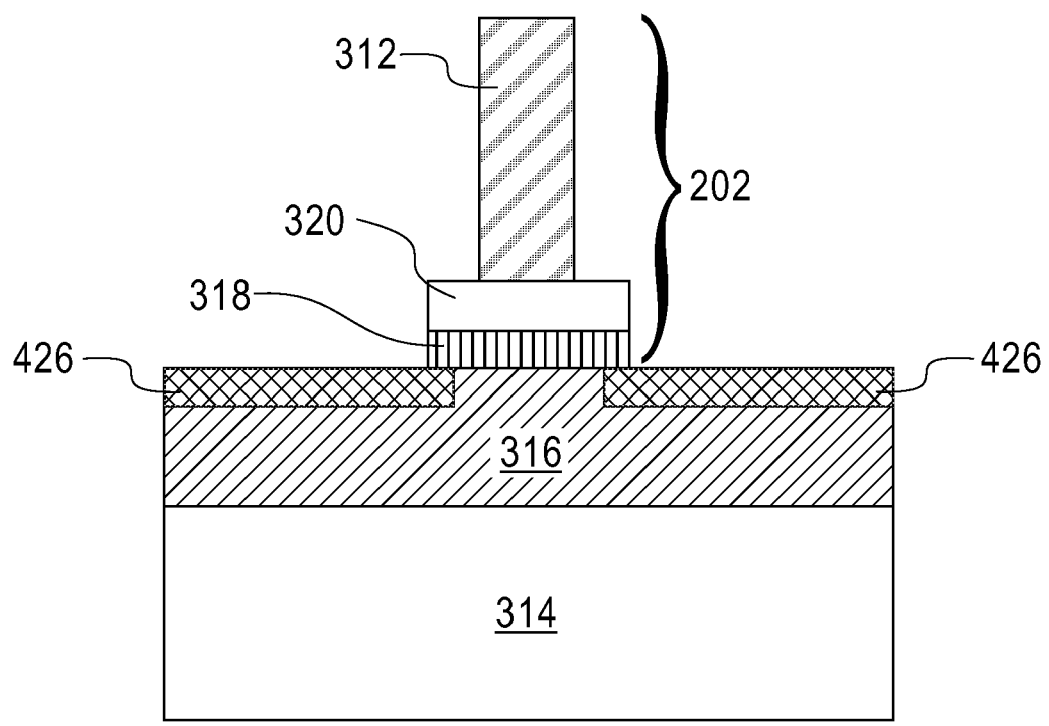

The disposable spacer 424 that was used to offset the ion implantation from the gate edge is then removed, such as through a hot phosphoric acid etch, other wet dip process, or through a highly selective RIE etch. After the disposable spacer 424 is removed, the width of the polysilicon layer 312 of the gate stack is then substantially reduced using a process that is selective between the polysilicon and the other exposed materials, such as RIE or wet etching. In this exemplary embodiment, the width of the polysilicon layer 312 is reduced to between about ⅓ and ½ of the width of the metal layer 320. This creates the "reverse-T" gate 202, as shown in FIG. 5. That is, a lateral extent (width) of the high-k and metal layers 318 and 320 is substantially greater than a lateral extent (width) of the polysilicon layer 312 of the gate stack. As explained above, this substantial reduction in the width of the polysilicon layer 312 results in a reduction in the parasitic capacitance between the polysilicon layer and the adjacent contact stud.

Figure 6:
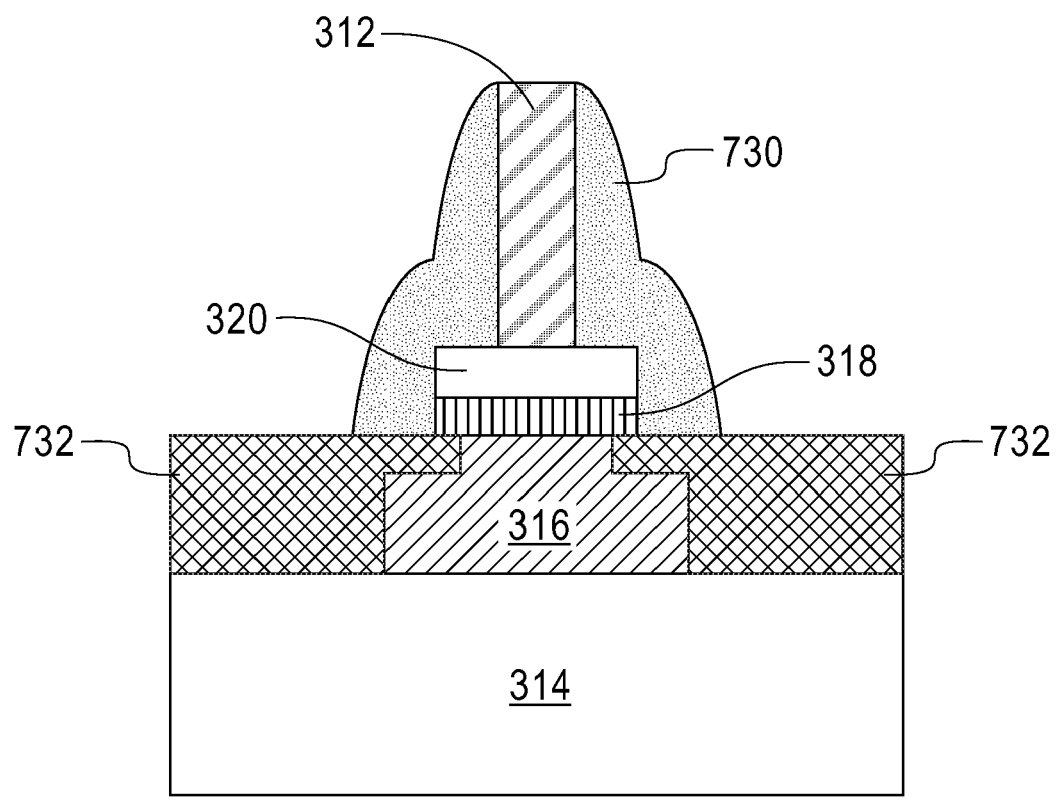

As shown in FIG. 6, at least one oxide and/or nitride diffusion spacer 730 is formed by depositing and etching one or more layers of nitride and/or oxide (for example, using PECVD). The diffusion spacer 730 of this embodiment has an exemplary thickness of about 2-10 nm. Source and drain regions are then implanted. The source/drain implant is performed using a p-type species for an NFET (for example, As or P) or using an n-type species for a PFET (for example, B or $BF_2$). A subsequent rapid thermal anneal (RTA) is performed (e.g., millisecond laser anneal or flash anneal) to provide relatively deep diffusions for the source and drain regions 732, which are separated by the gate region.

Figure 7:
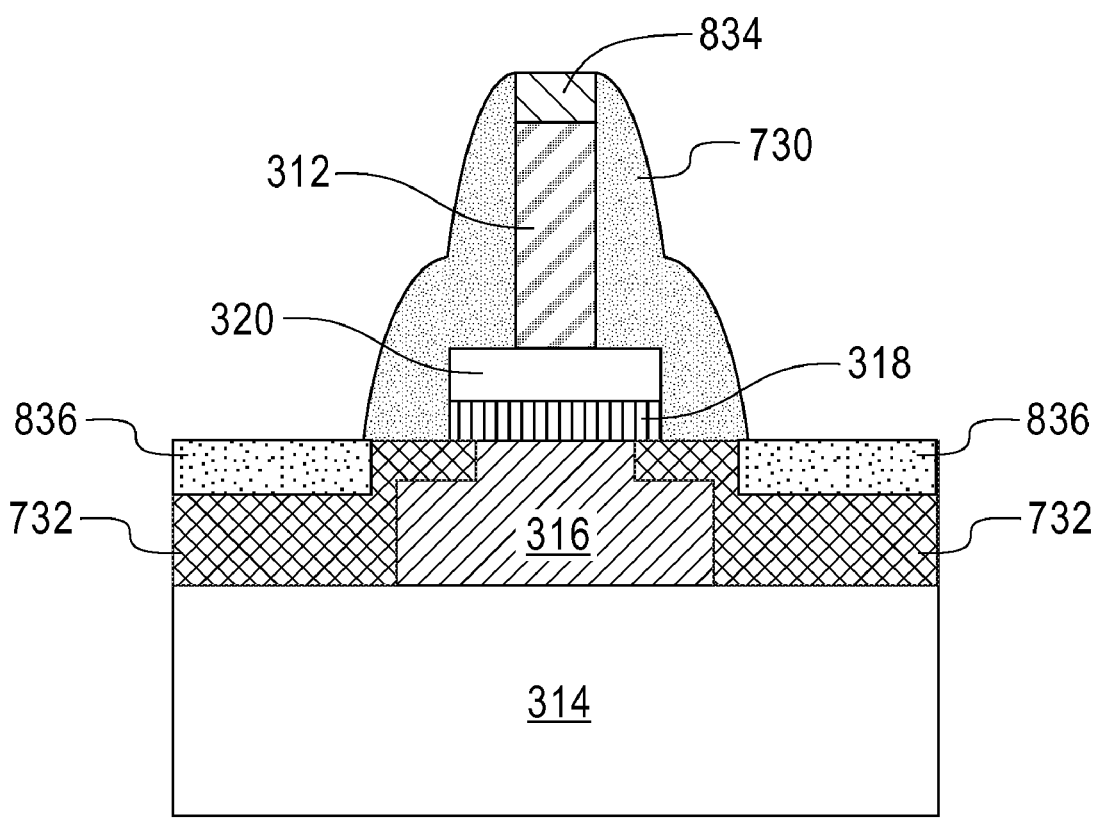

Subsequent conventional processing is used to silicide the gate, source, and drain (typically with Ni or Co) to complete the transistor, as shown in FIG. 7. The silicide contact areas 834 and 836 are formed using the diffusion spacer 730 for alignment. In particular, a portion for the contact area is removed (e.g., through a wet etch using HF), a metal is deposited, an anneal is performed to form silicide, and then the metal is selectively removed so as to leave the silicide (e.g., through an aqua regia wet etch). In this exemplary embodiment, the metal is nickel, cobalt, titanium, or platinum.

FIGS. 8-12 show another embodiment of a process for fabricating an MHK transistor with a reverse-T gate. This fabrication process is the same as the first embodiment through the deposition of the polysilicon (or amorphous silicon) layer of the gate stack. In particular, there is an SOI wafer that has, formed on a silicon substrate, an overlying oxide layer ("BOX") 914, and an overlying silicon layer 916. A high-k layer 918 (e.g., of hafnium dioxide) and a metal layer 920 (e.g., of titanium nitride) are deposited on the silicon layer 916. The polysilicon (or amorphous silicon) layer 912 is then deposited on the metal layer 920.

Figure 8:
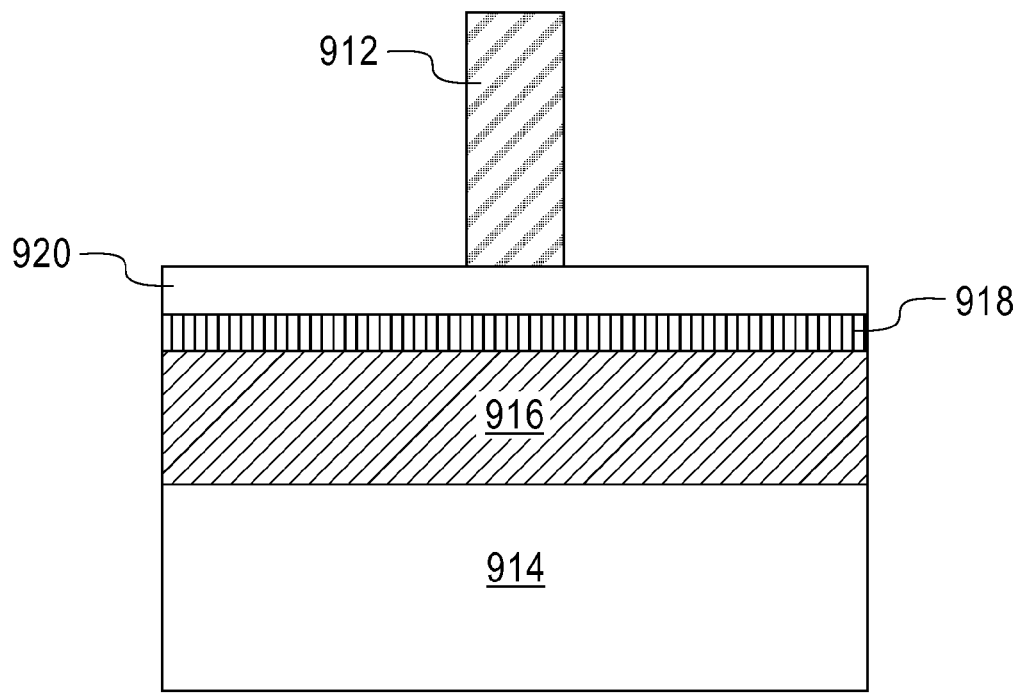
FIGS. 8-12 are cross-sectional views of a process for fabricating a metal high dielectric constant transistor having a reverse-T gate in accordance with a second embodiment of the present invention.

At this point, in the process of the second embodiment the polysilicon layer 912 is etched using a wet etch and/or dry etch process, as shown in FIG. 8. Any etching process can be used that is selective between the polysilicon layer 912 and the metal layer 920.

Figure 9:
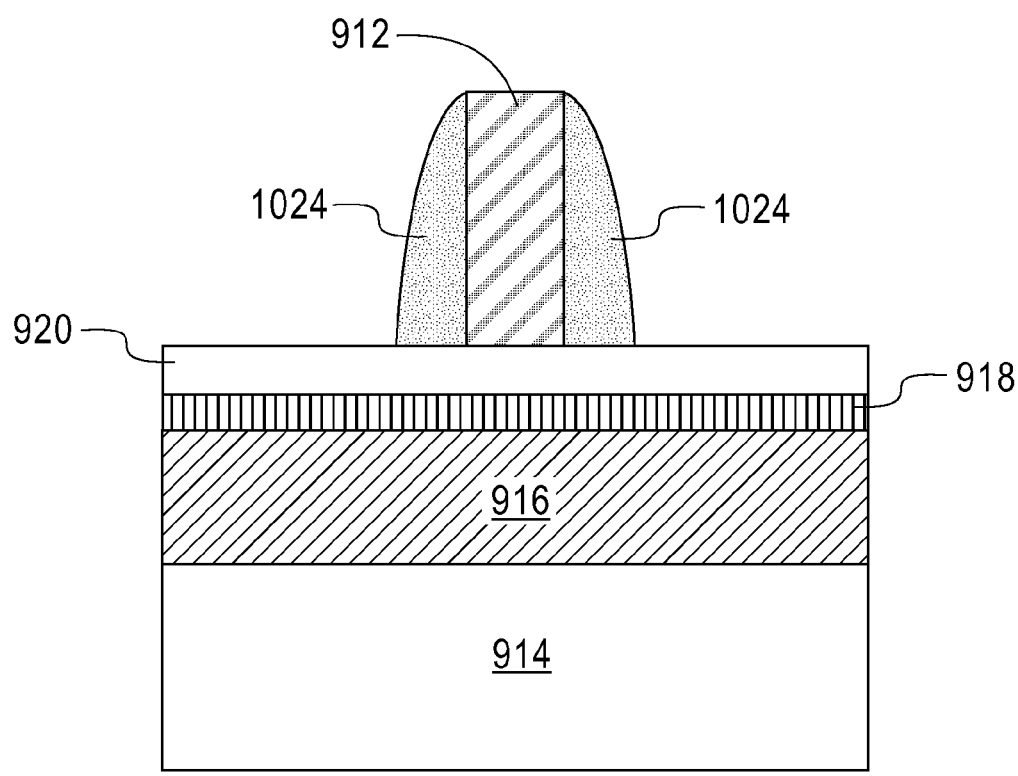

After the polysilicon is etched, a spacer 1024 is formed on the sidewalls of the polysilicon layer 912, as shown in FIG. 9. The spacer 1024 of this embodiment is a nitride spacer that is formed by depositing a nitride layer (e.g., using RTCVD or PECVD) and then performing an RIE that stops on an underlying oxide liner so as not to consume any of the underlying silicon.

Figure 10:
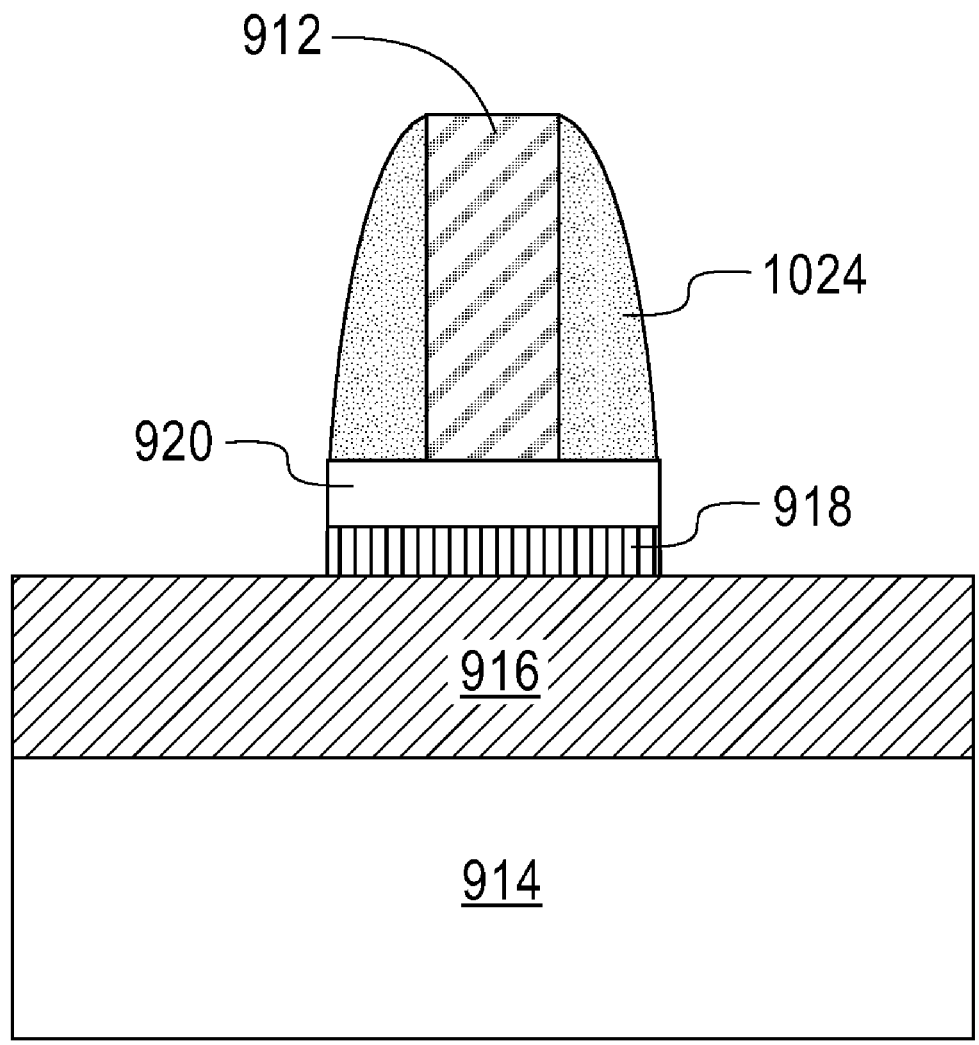

After the spacer is formed, a gate stack etch is performed to etch the metal layer 920 and the high-k layer 920 of the gate stack, as shown in FIG. 10. The spacer 1024 and the polysilicon layer 912 are used as a mask for the gate etch, which stops on the silicon layer 916. In this embodiment, a dry etch process such as a plasma etch and/or a wet etch process such as a chemical etch are used to etch the metal and high-k layers of the gate stack.

Thus, the fabrication process of this embodiment also creates a "reverse-T" gate, as shown in FIG. 10. That is, a lateral extent (width) of the high-k and metal layers 918 and 920 is substantially greater than a lateral extent (width) of the polysilicon layer 912 of the gate stack. For example, in this embodiment, the width of the polysilicon layer 912 is between about ⅓ and ½ of the width of the metal layer 920. As explained above, this substantial reduction in the width of the polysilicon layer 912 results in a reduction in the parasitic capacitance between the polysilicon layer and the adjacent contact stud.

Figure 11:
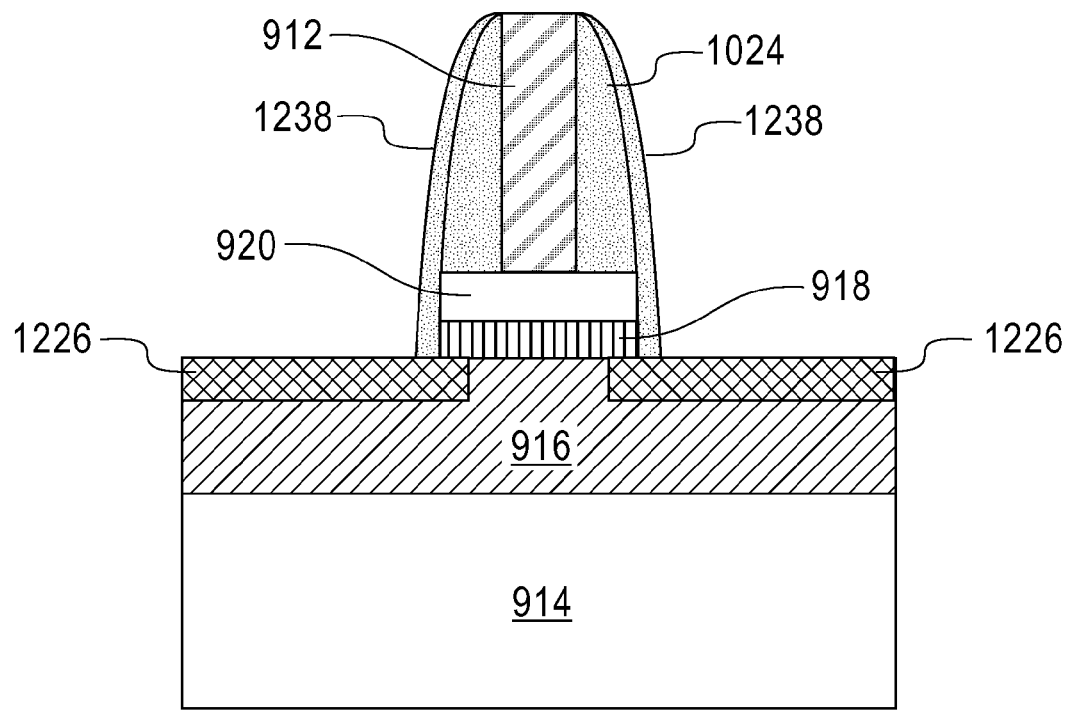

Next, an additional spacer 1238 is formed over the sidewalls of the spacer 1024, the metal layer 920, and the high-k dielectric layer 918, as shown in FIG. 11. This additional spacer 1238 is formed by depositing nitride and/or oxide layers and then performing an etch.

Photolithography and ion implantation are then used to define source/drain extensions, as explained above with respect to the first embodiment. The additional spacer 1238 is used to offset the ion implantation from the gate edge.

Figure 12:
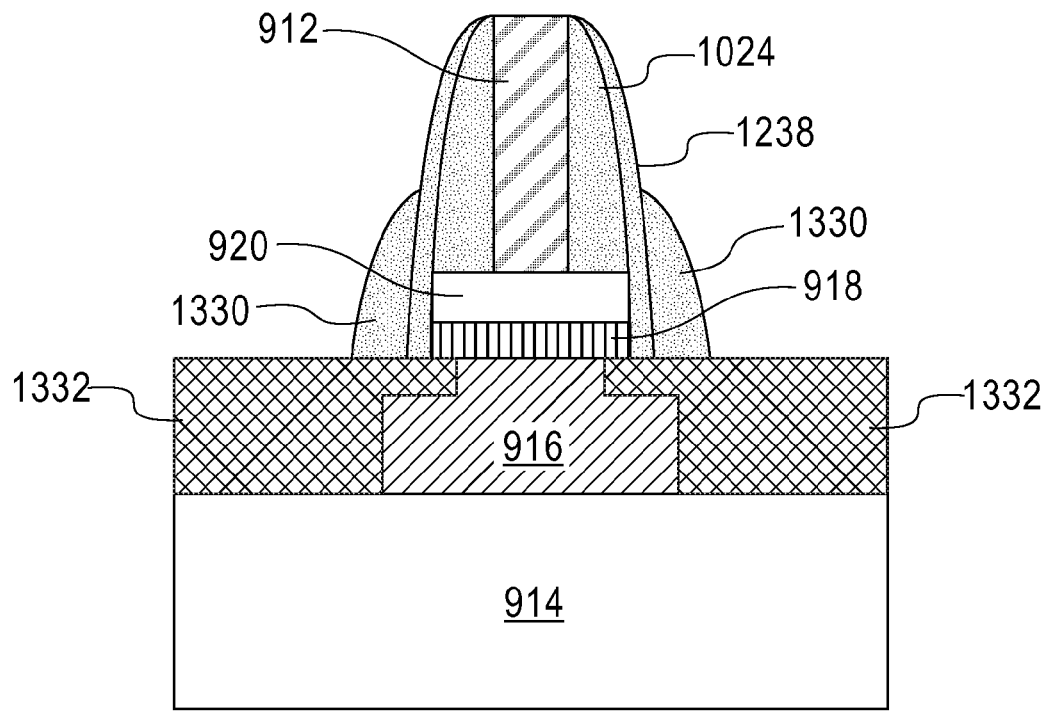

As shown in FIG. 12, a diffusion spacer 1330 is formed by depositing and etching nitride and/or oxide (for example, by PECVD). The diffusion spacer 1330 of this embodiment has a thickness of about 2-10 nm. Source and drain regions are then implanted. The source/drain implant is performed using a p-type species for an NFET (for example, As or P) or using an n-type species for a PFET (for example, B or $BF_2$). A subsequent rapid thermal annealing RTA provides relatively deep diffusions for the source and drain regions 1332, which are separated by the gate region. Subsequent conventional processing is used to silicide the gate, source, and drain (typically with Ni or Co) to complete the transistor, as explained above with respect to the first embodiment.

Accordingly, the present invention provides metal high-k dielectric (MHK) transistors with a reverse-T gate. This reverse-T gate is a gate stack having a polysilicon layer with a substantially reduced width, which increases the distance between the polysilicon layer of the gate stack and the adjacent contact stud. Therefore, the parasitic capacitance between the polysilicon layer and the contact stud is reduced.

The embodiments of the present invention described above are meant to be illustrative of the principles of the present invention. These MHK device fabrication processes are compatible with CMOS semiconductor fabrication methodology, and thus various modifications and adaptations can be made by one of ordinary skill in the art. All such modifications still fall within the scope of the present invention.

For example, while the exemplary embodiments of the present invention described above relate to gate structures that use hafnium dioxide for the high-k layer and titanium nitride for the metal layer, further embodiments can use other compatible materials, such as $ZrO_2$ or $HfSi_xO_y$, which both exhibit the high dielectric constant (e.g., k of approximately 20-25) needed to provide a larger equivalent oxide thickness. Similarly, other metal oxide-based materials may be used, such as a uniform or a composite layer comprised of one or more of $Ta_2O_5$, $TiO_2$, $Al_2O_3$, $Y_2O_3$ and $La_2O_5$. The metal-containing layer 114 could also be formed of another material, such as one or more of Ta, TaN, TaCN, TaSiN, TaSi, AlN, W and Mo. Additionally, the upper layer 312 of the gate stack can be comprised of any material that is able to be etched, remain conductive, and withstand high temperatures. Similarly, while the embodiments described above relate to a transistor on an SOI wafer, the transistors and fabrication methods of the present invention are also applicable to bulk technologies. Likewise, the various layer thicknesses, material types, deposition techniques, and the like discussed above are not meant to be limiting.

Furthermore, some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

What is claimed is:

1. A transistor comprising:
  a silicon layer including a source region and a drain region;
  a gate stack disposed on the silicon layer between the source region and the drain region, the gate stack comprising a first layer comprising a high dielectric constant material, a second layer comprising a metal or metal alloy, and a third layer comprising silicon or polysilicon; and
  source/drain extensions in the silicon layer, each of the source/drain extensions underlying part but not all of the second layer of the gate stack,
  wherein a lateral extent of the second layer of the gate stack is substantially greater than a lateral extent of the third layer of the gate stack.

2. The transistor of claim 1, further comprising at least one spacer disposed on sidewalls of the gate stack, a top surface of the at least one spacer being above a top surface of the third layer of the gate stack.

3. The transistor of claim 1, wherein each of the source/drain extensions in the silicon layer underlies part but not all of the first layer of the gate stack.

4. The transistor of claim 1, further comprising:
  a silicon substrate; and
  a buried oxide layer over the silicon substrate,
  wherein the silicon layer covers the buried oxide layer.

5. The transistor of claim 1,
  wherein the first layer of the gate stack comprises hafnium dioxide, and
  the second layer of the gate stack comprises titanium or a titanium alloy.

6. The transistor of claim 1, wherein a lateral distance between the source/drain extensions is less than the lateral extent of the second layer of the gate stack.

7. The transistor of claim 6, wherein a lateral distance between the source/drain extensions is less than the lateral extent of the first layer of the gate stack.

8. The transistor of claim 1, wherein a width of the third layer of the gate stack is between about ⅓ and ½ of a width of the second layer of the gate stack.

9. The transistor of claim 1, wherein the high dielectric constant material of the first layer of the gate stack has a dielectric constant (k) in the range of about 20-25.

10. The transistor of claim 1,
wherein the first layer of the gate stack has a thickness in the range of about 1-3 nm,
the third layer of the gate stack has a thickness in the range of about 30-100 nm, and
a thickness of the second layer of the gate stack is greater than the thickness of the first layer of the gate stack and less than the thickness of the third layer of the gate stack.

11. The transistor of claim 1, further comprising a contact area on the third layer of the gate stack, the contact area comprising a metal silicide.

12. The transistor of claim 11, further comprising a second contact area on the source region and a third contact area on the drain region, the second and third contact areas each comprising a metal silicide.

13. The transistor of claim 11,
wherein a width of the contact area on the third layer is substantially equal to a width of the third layer of the gate stack,
a width of the first layer of the gate stack is substantially equal to a width of the second layer of the gate stack, and
the width of the third layer of the gate stack is between about ⅓ and ½ of the width of the second layer of the gate stack.

14. An integrated circuit comprising a plurality of transistors, at least one of the transistors comprising:
a silicon layer including a source region and a drain region;
a gate stack disposed on the silicon layer between the source region and the drain region, the gate stack comprising a first layer comprising a high dielectric constant material, a second layer comprising a metal or metal alloy, and a third layer comprising silicon or polysilicon; and
source/drain extensions in the silicon layer, each of the source/drain extensions underlying part but not all of the second layer of the gate stack,
wherein a lateral extent of the second layer of the gate stack is substantially greater than a lateral extent of the third layer of the gate stack.

15. The integrated circuit of claim 14, wherein each of the source/drain extensions in the silicon layer underlies part but not all of the first layer of the gate stack.

16. The integrated circuit of claim 14, wherein a lateral distance between the source/drain extensions is less than the lateral extent of the second layer of the gate stack.

17. The integrated circuit of claim 14, wherein a width of the third layer of the gate stack is between about ⅓ and ½ of a width of the second layer of the gate stack.

18. The integrated circuit of claim 14, wherein the high dielectric constant material of the first layer of the gate stack has a dielectric constant (k) in the range of about 20-25.

19. The integrated circuit of claim 14, wherein the at least one transistor further comprises:
a contact area on the third layer of the gate stack;
a second contact area on the source region; and
a third contact area on the drain region,
wherein the first, second and third contact areas each comprise a metal silicide.

20. The integrated circuit of claim 14,
wherein a width of the contact area on the third layer is substantially equal to a width of the third layer of the gate stack,
a width of the first layer of the gate stack is substantially equal to a width of the second layer of the gate stack, and
the width of the third layer of the gate stack is between about ⅓ and ½ of the width of the second layer of the gate stack.

* * * * *